(12) United States Patent
Berk et al.

(10) Patent No.: US 11,769,989 B2
(45) Date of Patent: Sep. 26, 2023

(54) LONG WAVELENGTH VCSEL AND INTEGRATED VCSEL SYSTEMS ON SILICON SUBSTRATES

(71) Applicant: Mellanox Technologies, Ltd., Yokneam (IL)

(72) Inventors: Yuri Berk, Kiryat Tivon (IL); Vladimir Iakovlev, Ecublens (CH); Isabelle Cestier, Haifa (IL); Elad Mentovich, Tel Aviv (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 144 days.

(21) Appl. No.: 17/249,224

(22) Filed: Feb. 24, 2021

(65) Prior Publication Data

US 2022/0271499 A1    Aug. 25, 2022

(51) Int. Cl.
*H01S 5/00* (2006.01)
*H01S 5/343* (2006.01)
(Continued)

(52) U.S. Cl.
CPC ......... *H01S 5/34306* (2013.01); *H01S 5/021* (2013.01); *H01S 5/18308* (2013.01);
(Continued)

(58) Field of Classification Search
CPC .. H01S 5/34306; H01S 5/021; H01S 5/18308; H01S 5/18366; H01S 5/2086; H01S 5/3095; H01S 5/068; H01S 5/18344; H01S 5/3416; H01S 5/34313; H01S 5/34366
See application file for complete search history.

(56) References Cited

U.S. PATENT DOCUMENTS 9,966,733 B2 * 5/2018 Feng ............... H01S 5/3201
10,396,527 B2   8/2019 Sirbu et al.
(Continued)

OTHER PUBLICATIONS

Ayar Labs; Solution Brief; Paradigm Change: Reinventing HPC Architecture with In-Package Optical I/O; dated Jul. 20, 2020; downloaded from: https://insidehpc.com/2020/07/paradigm-change-reinventing-hpc-architectures-with-in-package-optical-i-o/; 9 pages.
(Continued)

*Primary Examiner* — Kinam Park
(74) *Attorney, Agent, or Firm* — Moore & Van Allen PLLC; R. W. McCord Rayburn

(57) ABSTRACT

VCSELs designed to emit light at a characteristic wavelength in a wavelength range of 910-2000 nm and formed on a silicon substrate are provided. Integrated VCSEL systems are also provided that include one or more VCSELs formed on a silicon substrate and one or more electrical, optical, and/or electro-optical components formed and/or mounted onto the silicon substrate. In an integrated VCSEL system, at least one of the one or more electrical, optical, and/or electro-optical components formed and/or mounted onto the silicon substrate is electrically or optically coupled to at least one of the one or more VSCELs on the silicon substrate. Methods for fabricating VCSELs on a silicon substrate and/or fabricating an integrated VCSEL system are also provided.

20 Claims, 22 Drawing Sheets

(51) Int. Cl.
  *H01S 5/183*   (2006.01)
  *H01S 5/30*    (2006.01)
  *H01S 5/02*    (2006.01)
  *H01S 5/20*    (2006.01)
  *H01S 5/068*   (2006.01)
  *H01S 5/34*    (2006.01)

(52) U.S. Cl.
  CPC ........ *H01S 5/18366* (2013.01); *H01S 5/2086* (2013.01); *H01S 5/3095* (2013.01); *H01S 5/068* (2013.01); *H01S 5/18344* (2013.01); *H01S 5/3416* (2013.01); *H01S 5/34313* (2013.01); *H01S 5/34366* (2013.01)

(56) References Cited

U.S. PATENT DOCUMENTS

| | | | |
|---|---|---|---|
| 10,601,201 B1* | 3/2020 | Sirbu | H01S 5/0203 |
| 2002/0131458 A1 | 9/2002 | Sirbu et al. | |
| 2003/0107034 A1 | 6/2003 | Viktorovitch et al. | |
| 2006/0050755 A1 | 3/2006 | Suzuki et al. | |
| 2006/0227835 A1 | 10/2006 | Ueki et al. | |
| 2008/0151959 A1 | 6/2008 | Nakagawa | |
| 2008/0212633 A1 | 9/2008 | Shimizu et al. | |
| 2011/0012221 A1* | 1/2011 | Fujikata | H01L 31/022408 257/458 |
| 2012/0128019 A1* | 5/2012 | Chang-Hasnain | H01S 5/423 372/45.01 |
| 2015/0010034 A1* | 1/2015 | Chang-Hasnain | H01S 5/32 372/50.124 |
| 2015/0288146 A1* | 10/2015 | Chang-Hasnain | H01S 5/18319 438/27 |
| 2016/0079736 A1* | 3/2016 | Yvind | G01B 9/02002 156/60 |
| 2017/0093128 A1 | 3/2017 | Fattal et al. | |
| 2018/0011248 A1 | 1/2018 | Bourstein et al. | |
| 2021/0305783 A1* | 9/2021 | Kalifa | H01S 5/0217 |

OTHER PUBLICATIONS

Bollani, M. et al.; "Selective Area Epitaxy of GaAs/Ge/Si Nanomembranes: A Morphological Study", Crystals 2020, 10(2), 57; https://doi.org/10.3390/cryst10020057; 9 pages.

Cooke, Mike, Semiconductor Today Compounds & Advanced Silicon, vol. 9, Issue 10, Dec. 2014/Jan. 2015, http://dx.doi.org/10.7567/.

Feng, Milton et al., "Oxide-Confined VCSELs for High-Speed Optical Interconnects", IEEE Journal of Quantum Electronics vol. 54, Issue 3: (Jun. 3, 2018).

Ferrara, J. et al.; "Heterogeneously Integrated Long-Wavelength VCSEL using High-Contrast Grating on Silicon", CLEO:2014 © 2014 OSA; 2 pages.

Fukushima, T. et al.; "New Three-Dimensional Integration Technology Using Chip-to-Wafer Bonding to Achieve Ultimate Super-Chip Integration"; Japanese Journal of Applied Physics, vol. 45, Part 1, No. 4B, 2006; pp. 3030-3035.

Huffaker, D. L. et al.; "Sealing AlAs Against Oxidative Decomposition and its Use in Device Fabrication," in CLEO'96, Anaheim, No. JTuH5; pp. 206-207.

Moser, P. et al.; "81 fJ/bit energy-to-data ratio of 850 nm vertical-cavity surface-emitting lasers for optical interconnects," Applied Physics Letters, vol. 98, No. 23, pp. 231106-231106-3, 2011.

Muller, M.; et al.; "1550-nm High-Speed Short-Cavity VCSELs," IEEE Journal of Selected Topics in Quantum Electronics, vol. 17, No. 5, pp. 1158-1166, 2011.

Non-Final Rejection for U.S. Appl. No. 16/828,764, dated Jun. 24, 2021, 26 pages.

Ohno, Y. et al.; "Chemical bonding at room temperature via surface activation to fabricate low-resistance GaAs/Si heterointerfaces", Applied Surface Science, vol. 525, Sep. 30, 2020, 146610; 5 pages.

Park, M. et al., "Hetero-integration Enables Fast Switching Time-of-Flight Sensor for Light Detection and Ranging"; Scientific Reports; NatureResearch; 2020; 10:2764; pp. 1-8.

Persano, A. et al.; "Thin Film Encapsulation for Rf MEMS in 5G and Modern Telecommunication Systems", Sensors (Basel). Apr. 2020; 20(7): 2133, 10.3390/s20072133; 12 pages.

Qiao, P. et al.; "Wavelength-Swept VCSELs"; IEEE Journal of Selected Topics in Quantum Electronics, vol. 23, No. 6, Nov./Dec. 2017; 16 pages; DOI: 10.1109/JSTQE.2017.2707181.

Sarmiento, T. et al., "Continuous-Wave Operation of GaAs-based 1.5 μm GaInNAsSb VCSELs", IEEE Phot. Tech. Lett, vol. 31, N8, (Aug. 2019).

Sirbu, A. et al., "Wafer-fused heterostructures: application to vertical cavity surface-emitting lasers emitting in the 1310 nm band", Semicond. Sci. Technol.26, 014016 (2011).

Sirbu, A. et al.; "Reliability of 1310 nm Wafer Fused VCSELs", IEEE Photonics Technology Letters, vol. 25, (16), pp. 1555-1558, 2013.

Suzuki, J. et al.; "Introduction of AlInAs-oxide current-confinement structure into GaInAsP/SOI hybrid Fabry-Pérot laser", Japanese Journal of Applied Physics 56, 062103 (2017).

* cited by examiner

LONG WAVELENGTH VCSEL AND INTEGRATED VCSEL SYSTEMS ON SILICON SUBSTRATES

TECHNICAL FIELD

Various embodiments relate to the fabrication of vertical-cavity surface-emitting lasers (VCSELs). Various embodiments relate to the fabrication of systems with VCSELs, such as long wavelength VCSELs, for example, integrated on various host wafers, such as silicon wafers, for example.

BACKGROUND

In various scenarios it is desirable to integrate VCSELs into system by coupling light emitted by VCSELs into photonic integrated circuits. VCSELs are generally fabricated on a GaAs wafer due to various parameters for fabricating VCSELs. However, GaAs does not provide an appropriate substrate for various electrical, optical, and/or electro-optical components that may be electrically and/or optically coupled to a VCSEL for various applications.

Additionally, traditional VCSELs tend to emit at wavelengths which are not appropriate for long range communication (e.g., optical links that communicate over distances longer than five hundred meters). This places limits on the usability of VCSELs in some applications where use of VCSELs would otherwise be appropriate.

BRIEF SUMMARY

The use of VCSELs for optical transmission in fiber optic systems has provided several advantages over commonly used edge-emitting lasers. For example, VCSELs require less electrical power consumption and can be manufactured with a lower cost than edge-emitting lasers. One aspect of this efficiency is provided by the on-wafer testing capability of VCSELs. The on-wafer testing results in a considerable cost advantage compared with conventional testing techniques used for edge emitting lasers. Furthermore, VCSELs provide reliable operation over time, which is essential for applications in fiber optic systems.

In various scenarios it may be desired to integrate VCSELs in systems by coupling light emitted by VCSELs into photonics integrated circuits. The progress in silicon photonics (SiP) in high speed modulators and photodetectors may enable the realization of a transmitter-receiver (Tx-Rx) on a single silicon chip. In various embodiments of this configuration, there is a potential to implement a VCSEL only as a photon generator, and this may be the only based III-V groups material part of the Tx-Rx. The rest of the elements of the Tx-Rx may be fabricated using SiP design and fabrication tools. Various embodiments described herein provide improvements in GaAs-based VCSEL technology for long wavelength (910-2000 nm) VCSELs that decrease the technological challenges towards monolithically integrated single chip Tx-Rx, in particular, and for more complex VCSEL-based silicon photonics integrated systems.

In various embodiments, a VCSEL is fabricated by preparing two reflector blanks and an active region blank with a tunnel junction, that allows to minimize the amount of p-doped material with high losses in an optical path and assembling the reflector blanks and the active region blank together. The active region, fabricated out of epitaxial layers grown on InP or GaAs substrates, is patterned to provide current and optical confinement using (i) a buried tunnel junction or (ii) an oxide confinement layer or (iii) an ion-implanted region sandwiched between two reflectors. The reflectors are often denoted top or bottom ($1^{st}$ and $2^{nd}$ respectively), depending of their position order on the host substrate. The reflectors may have fixed positions for VCSELs emitting one fixed wavelength, or may have movable positions (e.g., using a micro-electrical-mechanical system (MEMS) component), for achieving wavelength tunability. The reflector material may include a semiconductor. For example, the reflector may include epitaxial layers on GaAs and/or InP material systems or dielectric layer materials. The reflectors may include distributed Bragg reflectors and/or high contrast gratings, in various embodiments.

To meet the continuously growing demands for increased bandwidth in telecommunication networks, caused by growing data traffic in big data centers as well as in local and access networks, the inventors have recognized a need for optimized design and fabrication method of high-performance VCSELs that can be integrated on silicon wafers.

Additionally, to meet the continuously growing demands for increased bandwidth of telecommunication networks, the inventors have recognized a need for integrating VCSELs into systems comprising electric, optical, and/or electro-optical components in addition to one or more VCSELs that may be electrically and/or optically coupled to one or more VCSELs. These additional electric, optical, and/or electro-optical components are generally built on silicon substrates. Due to fabrication requirements, VCSELs are generally formed on GaAs or InP substrates, thereby causing the fabrication of integrated VCSEL systems comprising one or more additional electric, optical, and/or electro-optical components formed on the same substrate as one or more VCSELs and comprising at least one component that is electrically and/or optically coupled to at least one of the one or more VCSELs quite difficult.

Moreover, due to constraints regarding the epitaxial growth process of the InP or GaAs-based active region, the growth of the active region directly on the first reflector, as is traditionally done for VCSELs having GaAs-based active regions, is challenging. Thus, attempts have been made to form reflector blanks comprising the first reflector on a substrate and patterned active region blanks comprising the active region of the VCSEL and bonding the two blanks together. However, due to thermal expansion coefficient differences between the materials of the reflector blank and the patterned active region blank, properly aligning the patterned features presents a technical problem and reduces the fabrication efficiency.

Various embodiments provide technical solutions to these technical problems. In particular, various embodiments provide an efficient VCSEL fabrication process that enables the fabrication of VCSELs on silicon substrates. Various embodiments provide VCSELs that are configured to emit at long wavelengths (e.g., emit a characteristic wavelength in 910-2000 nm range), formed on a silicon substrate and one or more electric, optical, or electro-optical components formed and/or mounted to the silicon substrate with at least one of the one or more electric, optical, or electro-optical components electrically and/or optically coupled to at least one of the one or more VCSELs. Various embodiments further provide methods for fabricating VCSELs configured to emit respective characteristic wavelengths in 910-2000 nm wavelength range and/or for fabricating VCSELs on a silicon substrate. Various embodiments additionally provide methods for fabricating integrated VCSEL systems on a silicon substrate.

According to an aspect of the present disclosure, a long wavelength VCSEL is provided. In an example embodiment, the long wavelength VCSEL comprises a mesa structure disposed on a silicon substrate. The mesa structure comprises a first reflector, a second reflector, and an active region disposed between the first and second reflectors. The active region comprises quantum well and/or dots layers. The quantum well and/or dots layers are configured to cause the VCSEL to emit light having a characteristic wavelength in 910-2000 nm wavelength range. In an example embodiment, the long wavelength VCSEL further comprises a first current spreading layer and a first contact. The first contact is in electrical communication with the first current spreading layer. The first current spreading layer is disposed between the first reflector and the active region. In an example embodiment, the long wavelength VCSEL further comprises a second current spreading layer and a second contact. The second contact is in electrical communication with the second current spreading layer. The second current spreading layer is disposed between the second reflector and the active region.

According to another aspect, an integrated VCSEL system is provided. In an example embodiment, the integrated VCSEL system comprises a VCSEL. The VCSEL comprises a mesa structure disposed on a silicon substrate. The mesa structure comprises a first reflector, a second reflector, and an active region disposed between the first and second reflectors and including quantum well and/or dots layers. The integrated VCSEL system further comprises one or more optical, electrical, or electro-optical components mounted or formed on the silicon substrate.

According to still another aspect, a method for fabricating a long wavelength VCSEL (which may be a part of an integrated VCSEL system) is provided. In an example embodiment, the method comprises forming a first reflector form on a silicon substrate; bonding an un-patterned epi layer form onto the first reflector form, the un-patterned epi layer form comprising a plurality of un-patterned epitaxially grown layers on a first substrate; removing the first substrate to form a bonded blank, wherein the bonded blank is substantially non-varying in an xy plane, the xy plane being normal to an intended emission direction of the VCSEL; performing a patterning process to form current and optical confinement in a sequence of layers comprising a tunnel junction and quantum wells and/or dots configured to emit light having a characteristic wavelength in the 910-2000 nm wavelength range; and disposing a second reflector form onto the patterned layers.

BRIEF DESCRIPTION OF THE DRAWING(S)

Having thus described the invention in general terms, reference will now be made to the accompanying drawings, which are not necessarily drawn to scale, and wherein:

Figure 3:
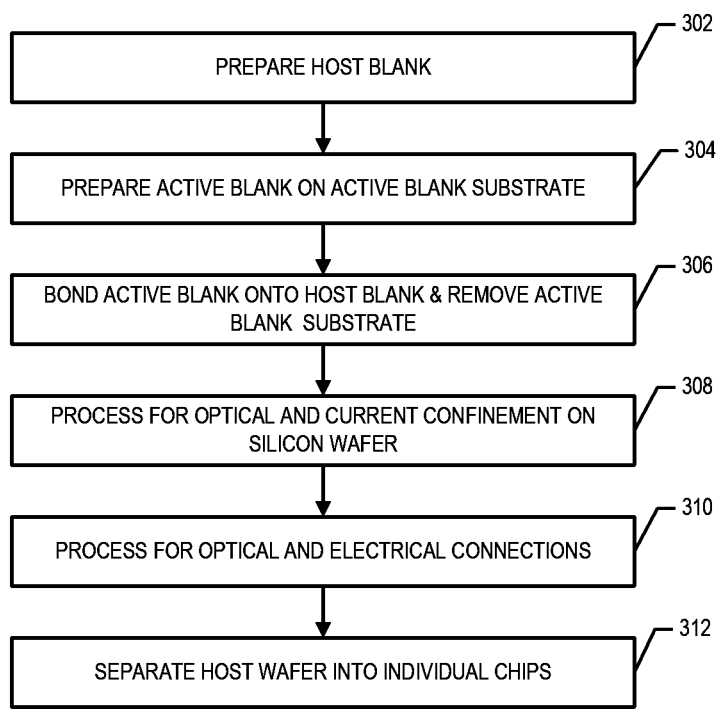

FIG. 3 provides a flowchart illustrating various processes, procedures, and/or operations for fabricating an integrated VCSEL system, in accordance with an example embodiment;

FIGS. 4A-4E illustrate some of the steps of fabricating a VCSEL having buried tunnel junction current confinement, according to an example embodiment;

FIGS. 5A-5F illustrate some of the steps of fabricating a VCSEL having oxide current confinement, according to an example embodiment; and FIG. 6A-6F illustrate some of the steps of fabricating a VCSEL having ion-implanted current confinement, according to an example embodiment. ion-implanted

DETAILED DESCRIPTION OF THE INVENTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "bottom," "front," etc. are used for explanatory purposes in the examples provided below to describe the relative position of certain components or portions of components. Accordingly, as an example, the term "top current spreading layer" may be used to describe a current spreading layer; however, the current spreading layer may be on the top or on the bottom, depending on the orientation of the particular item being described. As used herein, the terms "approximately" and "substantially" refer to within tolerances within appropriate manufacturing and/or engineering standards.

As noted above, VCSELs have been traditionally fabricated on GaAs substrates with GaAs-based active regions. Various embodiments described herein provide VCSELs that are fabricated on silicon substrates with GaAs or InP-based active regions and that emit light having a characteristic wavelength in 910-2000 nm wavelength range. For example, various embodiments provide VCSELs that emit light having a characteristic wavelength in the 910-2000 nm wavelength range. As these VCSELs are fabricated on silicon substrates, the VCSELs may be incorporated into and/or formed as part of an integrated VCSEL system comprising one or more VCSELs and one or more additional (e.g., non-VCSEL) electric, optical, and/or electro-optical components with at least one of the one or more additional electric, optical, and/or electro-optical components being electrically and/or optically coupled to at least one of the one or more VCSELs. In various embodiments of the integrated VCSEL system, the one or more additional electric, optical, and/or electro-optical components are formed on and/or mounted onto the same silicon substrate as the one or more VCSELs. Various embodiments provide methods for fabricating such VCSELs and/or integrated VCSEL systems.

The technical solutions provided by the various embodiments of the VCSEL, integrated VCSEL systems, and fabrication methods described herein address technical problems that have prevented the fabrication of VCSELs on silicon substrates having long term reliability and corresponding integrated VCSEL systems. For example, VCSELs are conventionally fabricated by forming a first reflector on a GaAs substrate, building an active region structure via epitaxially growth processes onto the first reflector, and then forming a second reflector on the active region structure. Due to various details regarding the building of the active region structure, it is impractical to grow epitaxial layers of the active region structure onto a silicon substrate (or onto a first reflector formed on a silicon substrate). Thus, the physics and chemistry involved in fabricating of long wavelength VCSELs (VCSELs that emit a characteristic wavelength in 910-2000 nm wavelength range) and the integration of such VCSELs into integrated VCSEL systems present significant technical problems which are addressed by various embodiments described herein.

Example VCSEL

Figure 1A:
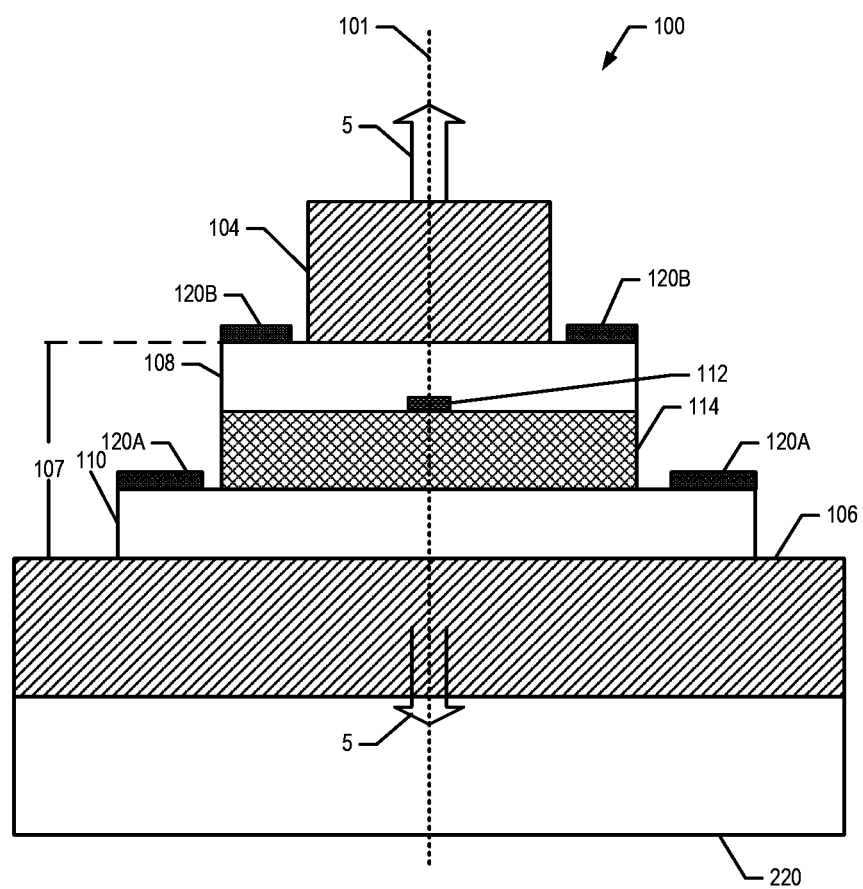
FIG. 1A illustrates a schematic cross-sectional view of a vertical-cavity surface-emitting laser (VCSEL), in accordance with an example embodiment with buried tunnel junction current confinement.
Figure 1B:
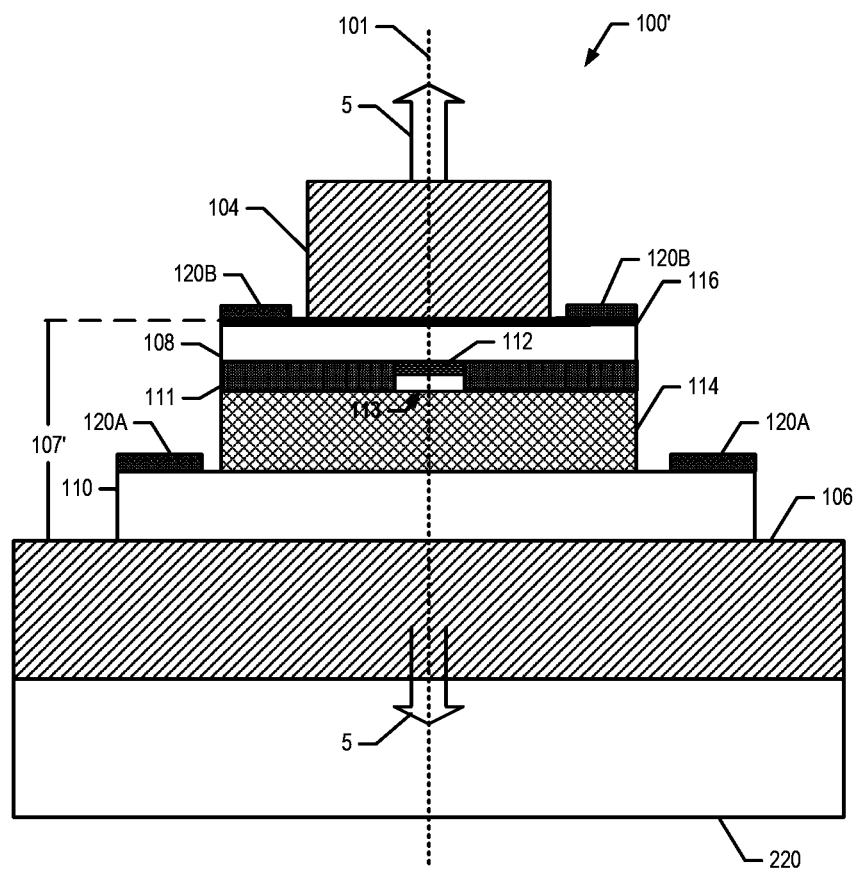
FIG. 1B illustrates a schematic cross-sectional view of a VCSEL, in accordance with another example embodiment with oxide current confinement.
Figure 1C:
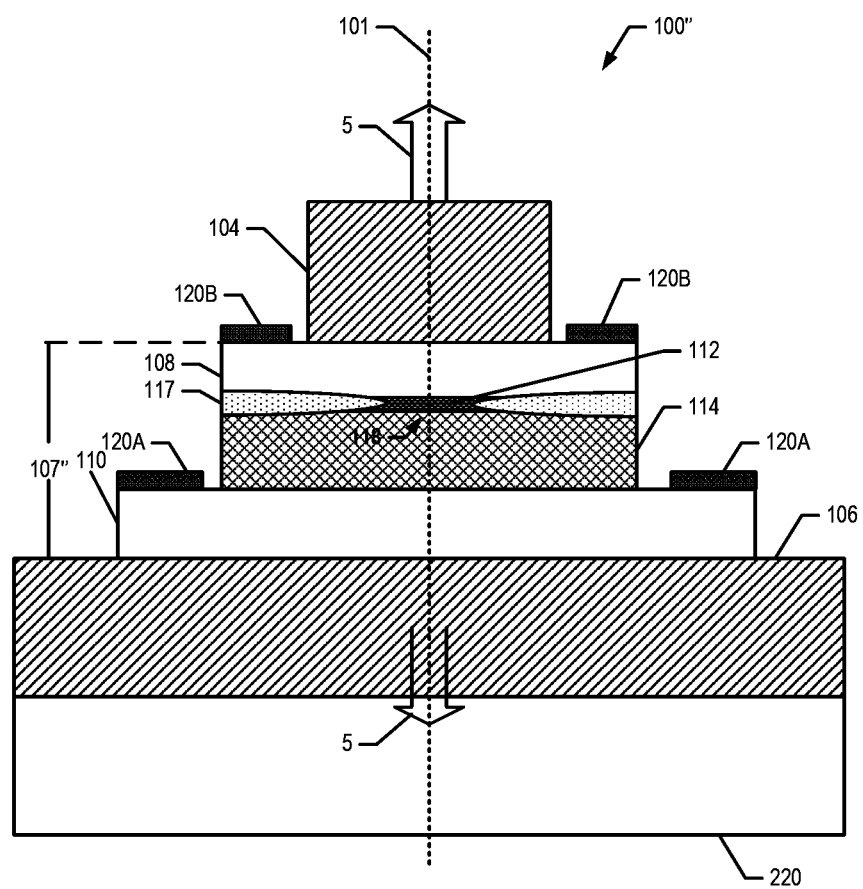
FIG. 1C illustrates a schematic cross-sectional view of a VCSEL, in accordance with another example embodiment with ion-implanted current confinement.

FIGS. 1A, 1B and 1C each illustrate an example embodiment of a vertical-cavity surface-emitting laser (VCSEL) 100. The VCSELs 100 illustrated in FIGS. 1A, 1B, and 1C differ from one another in the structure used for current confinement. For example, each of the VCSELs 100 shown in FIGS. 1A, 1B, and 1C comprise a tunnel junction 112. The VCSEL 100 shown in FIG. 1A comprises a buried tunnel junction providing current and optical confinement. The VCSEL 100' illustrated in FIG. 1B comprises an oxide confinement layer 111 providing current and optical confinement. The VCSEL 100" shown in FIG. 1C comprises ion-implanted regions 117 providing current and optical confinement.

In various embodiments, a VCSEL 100 is configured to emit light 5 for use in a variety of applications, such as fiber optic data transmission in high-speed fiber optic communication systems. In various embodiments, the VCSEL 100 is configured to emit light having a characteristic wavelength in 910-2000 nm wavelength range. The VCSEL 100 is formed and/or fabricated on a silicon substrate 220. VCSELs similar to the VCSEL 100 illustrated in FIG. 1A but fabricated on InP or GaAs wafers demonstrate good performance in continuous wave (CW) and high-speed data transmission, as well as reliable operations, important for applications in fiber-optics communication systems.

In various scenarios, a plurality of VCSELs 100 may be generated on a large silicon substrate (e.g., a silicon wafer). In an example embodiment, the silicon substrate (e.g., silicon wafer) has at least one dimension (e.g., length, width, or radius) larger than two inches. The VCSELs 100 may be separated via a dicing procedure, used as an array of VCSELs, incorporated into an integrated VCSEL system, and/or the like, as appropriate for the application.

Figure 2:
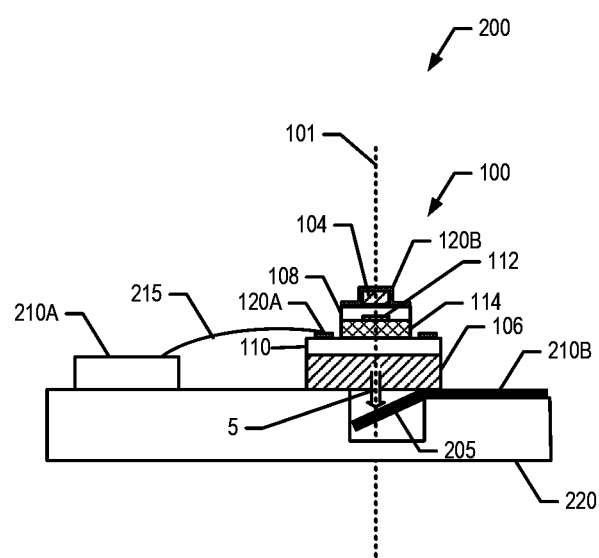
FIG. 2 illustrates a schematic cross-sectional view of an integrated VCSEL system, in accordance with another example embodiment.

The structure of the VCSEL 100 includes an active material structure disposed between two reflectors. For example, FIGS. 1A, 1B, and 1C illustrate the active material structure 107 disposed between a first reflector 106 and a second reflector 104. In various embodiments, the active material structure 107 is configured to be operable to generate light of a characteristic wavelength. In various embodiments, the first and second reflector 106, 104 form a cavity therebetween configured to cause the light generated by active material structure 107 to be emitted as a laser beam and/or laser pulses. For example, the VCSEL 100 may emit light 5 through the second reflector 104 or through the first reflector 106, as appropriate for the application. In various embodiments where the light is emitted through first reflector 106 into the silicon substrate or coupled to silicon waveguide, for example, the emission wavelength range of light 5 for the VCSEL 100 is in the wavelength range 1100-2000 nm. As can be seen in FIGS. 1A, 1B, and 1C, the direction in which light 5 is emitted from the VCSEL 100 defines an axis 101 of the VCSEL. In various embodiments, the VCSEL 100 is generally rotationally and/or radially symmetric about the axis 101. In various embodiments, the emission direction can be configured towards first reflector (a so-called bottom emitting configuration), as shown in FIG. 2.

In various embodiments, the first reflector 106 and/or the second reflector 104 comprises reflector stacks (e.g., dielectric layer stacks). For example, the first reflector 106 and/or the second reflector 104 may comprise un-doped semiconductor distributed Bragg reflector (DBR) mirrors. For example, the first reflector 106 and/or the second reflector 104 may comprise un-doped alternating layers of aluminum gallium arsenide (AlGaAs) and gallium arsenide (GaAs). In various embodiments, the second reflector 104 may comprise a DBR mirror and the first reflector 106 may comprise a micro-electromechanical systems (MEMS) component. For example, a MEMS component may be fabricated on the silicon substrate 220 to form the first reflector 106. In an example embodiment, the first reflector 106 comprises a MEMS high-contrast grating (HCG). In various embodiments, the first reflector 106 may be a hybrid reflector comprising a combination of MEMS components and reflector stacks, such as DBR mirrors.

In various embodiments, a MEMS HCG comprises a thin element having a grating pattern thereon/therein with the period of the grating pattern being smaller than the characteristic wavelength of the corresponding VCSEL 100. In such embodiments, the grating pattern is formed in a first material and is surrounded by and/or embedded in a second material, where the second material has a lower index of refraction than the first material. In various embodiments in which the first reflector 106 comprises a MEMS component (e.g., a MEMS HCG), the MEMS component may be fabricated with lateral coupling functionality such that it is possible to directly couple the light 5 emitted by the VCSEL in one lateral direction or in both lateral directions, as shown in FIG. 2. In various embodiments, a lateral direction is a direction that is substantially parallel to a plane defined by a surface of the silicon substrate 220. For example, the MEMS component of the first reflector 106 (e.g., MEMS HCG and/or the like) may be used to optically couple the VCSEL to another optical and/or electro-optical component formed on and/or mounted to the silicon substrate 220.

In various embodiments, the first reflector 106 may be operable to and/or configured to control the shape and/or polarization of the beam and/or pulse of light 5 emitted by the VCSEL 100. In various embodiments, the first reflector 106 may be operable to and/or configured to tune the wavelength of light emitted by the VCSEL 100.

The active material structure 107 may be sandwiched between the first and second reflectors 106, 104 and may comprise an active region 114. In various embodiments, the active region 114 comprises a stack of quantum well and/or quantum dot layers. The active material structure 107, may further include a buried tunnel junction 112. In various embodiments, the aperture 113 is formed in an oxide confinement layer 111, or aperture 118 is formed between ion-implanted region 117. Buried tunnel junction is defined by an overgrown region embedded within second current spreading layer 108. In various embodiments, light is generated by injecting electrical current through a current confinement aperture defined by the buried tunnel junction 112, an aperture 113 in an oxide confinement layer 111, and/or an aperture 118 in an ion-implanted region 117. The optical mode(s) of the VCSEL are confined within optical confinement aperture. In various embodiments, the buried tunnel junction 112, the aperture 113 in the oxide confinement layer 111, and/or the aperture 118 in the ion-implanted region 117 acts as the optical and electrical confinement aperture for the VCSEL 100.

In various examples, the active region 114 comprises a plurality of quantum wells, where light 5 is generated, between the reflectors 104 and 106. In some examples, the active region 114 may comprise multi-quantum well and/or dots layers (MQLs) of VCSEL gain media. For example, the MQLs may comprise a stack or a series of quantum wells disposed between a series of (quantum) barriers. In various embodiments, the MQLs are configured to generate light having a wavelength in the 910-2000 nm wavelength range. In various embodiments, the MQLs are formed from an GaAs or InP-based semiconductor materials.

In various embodiments, the active material structure 107 comprises a p-type region (layer) disposed between the second current spreading layer 108 and the MQL stacks outside the tunnel junction, and a tunnel junction 112 disposed on the p-type region (layer). In various embodiments, the tunnel junction layer 112 comprises one or more tunnel junction sublayers. For example, the tunnel junction 112 may comprise a p++ tunnel junction sublayer and an n++ tunnel junction sublayer.

In various embodiments, a tunnel junction 112, as shown in FIG. 1B or 1C, is formed from a layer that extends across the active material structure 107. For example, a tunnel junction form 512, 612 (see FIGS. 5A and 6A) formed by epitaxially growing one or more layers of semiconductor material and re-growing and/or overgrowing the one or more layers. The re-growing and/or overgrowing process may cause the tunnel junction form 512, 612 to include a p++ tunnel junction sublayer and an n++ tunnel junction sublayer. The tunnel junction 112 may then be defined from the tunnel junction form 512, 612 by etching and/or oxidizing a to-be oxidized layer 511 to form an oxidation confinement layer 111 that defines an aperture 113 or implanting ions to form an implantation region form 617 defining an aperture 118. In an example embodiment comprising a tunnel junction 112, the electrical and optical confinement may be accomplished using an oxide confinement layer 111 having an aperture 113 defined therein that may act as the current confinement aperture and the optical confinement aperture, as shown in FIG. 1B. For example, the diameter of the aperture 113 may define the emission aperture of the VCSEL 100. In another example embodiment comprising a tunnel junction 112, the electrical and optical confinement may be accomplished using an ion-implanted region 117 defining an aperture 118 defined therein that may act as the current confinement aperture and the optical confinement aperture, as shown in FIG. 1C. For example, the diameter of the aperture 118 may define the emission aperture of the VCSEL 100. In various embodiments, the ion-implanted region 117 is annular. In an example embodiment, the ion-implanted region 117 is formed by implanting protons. For example, the ions may be implanted in the ion-implanted region 117 with a density in the range of $2-6 \times 10^{14}$ per $cm^2$. In an example embodiment, the ions are implanted at an energy in the range of 150 to 200 keV. The implantation of the ions (e.g., protons) converts the ion-implanted region 117 from a semiconductor to an electrical insulator material.

A buried tunnel junction 112, as shown in FIG. 1A, is a tunnel junction that is formed and/or regrown within a semiconductor layer and does not extend across the entire active region structure 107. For example, the buried tunnel junction 112, shown in FIG. 1A, may be a "mesa within a mesa." The buried tunnel junction 112 may, for example, comprise an overgrown region that provides both current and photon confinement. For example, the buried tunnel junctions 112 may be embedded in a respective overgrown region that provides both current and photon confinement. For example, the active blank 415 may include a tunnel junction form 412 that has not yet been regrown (see FIG. 4A). After the active blank 415 is bonded to the host blank 402 and the active blank substrate 418 is removed, the tunnel junction form 412 may be patterned and then a re-growing and/or overgrowing process may be used to create a buried tunnel junction from the remaining portion of the tunnel junction form 412. In an example embodiment comprising a buried tunnel junction 112, the electrical and optical confinement may be accomplished by the buried tunnel junction (and a possible oxidization about a periphery of the second reflector 104). The buried tunnel junction may act as the optical confinement aperture and the electrical confinement aperture, in such an embodiment. In this example, the current is confined by the reverse p-n junction that is formed at the interface between the second current-spreading layer 108 and a p-layer comprising a second surface of the active region 114. For example, the diameter of the buried tunnel junction 112 may define the emission aperture of the VCSEL 100.

In various embodiments, the active material structure 107 further comprises first and second current spreading layers 110, 108. For example, the first and second current spreading layers may act as global contacts providing voltage and/or current to the active material structure 107. In an example embodiment, the first and/or second current spreading layer 110, 108 may comprise a contact layer 116. In various embodiments, the contact layer 116 may be a thin metal layer (e.g., a thin metal ring) configured to distribute current across a corresponding one of the first and/or second current spreading layer 110, 108. For example, the contact layer 116 may distribute current across the second current spreading layer 108 with less resistance than when the current is distributed across by the second current spreading layer 108 by the second current spreading layer 108 alone. In various embodiments, the first and second current spreading layers 110, 108 are configured (possibly with corresponding contact layer(s) 116) to provide electrical bias (e.g., a voltage differential and/or a current) to surfaces of the active region 114 that are substantially perpendicular to the axis 101. For example, the first and second current spreading layers 110, 108 may be configured (possibly with corresponding contact layer(s) 116) to establish a voltage differential and/or provide a current between a surface of the active region 114 adjacent and/or abutting the first current spreading layer 110 and a surface of the active region 114 comprising a buried tunnel junction 112, a tunnel junction 112 and adjacent an oxide confinement layer 111, and/or a tunnel junction 112 and ion-implanted region 117.

The current spreading layers 108 and 110 may comprise n-type indium phosphide (n-InP) layers. For example, providing the electrical contact to the active region 114 through the n-type current spreading layers 110, 108 may allow for the first reflector 106 and/or the second reflector 104 to comprise un-doped semiconductor DBR mirrors. In some examples, the manufacturing process of the VCSEL creates a mesa structure as shown by the active region 114, the top current spreading layer 108, and the second reflector 104. The mesa structure may be formed on top of the underlying structures (e.g., bottom current spreading layer 110, first reflector 106, silicon substrate 220, and/or the like). For example, the manufacturing process may include reactive ion etching (RIE) and chemical etching through the various layers to form a mesa structure.

In various embodiments, the VCSEL 100 further comprises first contacts 120A and second contacts 120B. For example, the first contacts 120A may be in electrical communication with the first current spreading layer 110. The second contacts 120B may be in electrical communication with the second current spreading layer 108. In various embodiments, the first contacts 120A and the second contacts 120B are configured secure the VCSEL 100 into electrical communication with an external power and/or voltage source (e.g., a VCSEL driver and/or the like).

In various embodiments, the VCSEL 100 is configured to transmit optical modulated data bits traffic through single mode optical fibers and/or waveguides with a modulation speed of up to 50 gigabits per second (Gb/s) or faster. In various embodiments, the VCSEL 100 may emit light 5 having a wavelength in the 910-2000 nm wavelength range.

Example Integrated VCSEL System

Various embodiments provide an integrated VCSEL system 200, an example of which is illustrated by FIG. 2. In various embodiments, an integrated VCSEL system 200 comprises one or more VCSELs 100, formed and/or fabricated on a silicon substrate 220. The integrated VCSEL system 200 in such embodiments further comprises one or more electrical, optical, or electro-optical components 210 (e.g., 210A, 210B) other than the one or more VCSELs 100. For example, the electrical, optical, or electro-optical components 210 may comprise waveguides with modulators or/and detectors, laser drivers, receivers, fiber optic coupling devices, digital analog converters (DACs), photodiodes and/or other light sensors, and/or the like. For example, the one or more electrical, optical, or electro-optical components 210 may be fabricated and/or mounted onto the silicon substrate 220.

In various embodiments, at least one of the one or more electric, optical, or electro-optical components 210 are electrically and/or optically coupled, as appropriate for the component 210, to at least one of the one or more VCSELs 100. For example, an electrical or electro-optical component 210A fabricated and/or mounted on the silicon substrate 220 may be electrically coupled to a VCSEL 100 fabricated on the silicon substrate 220 via an electrical coupling 215. For example, the electrical coupling 215 may be an electrical lead, wire, trace, and/or the like configured to place the electrical or electro-optical component 210 into electrical communication with the VCSEL 100. For example, an optical or electro-optical component 210B fabricated and/or mounted on the silicon substrate 220 may be optically coupled to a VCSEL 100 fabricated on the silicon substrate 220 via an optical coupling 205. For example, the optical coupling 205 may be a coupler configured to place the optical or electro-optical component 210 into optical communication with the VCSEL 100. Some non-limiting examples of possible couplers include fiber optic cables, waveguides, MEMs HCG, mirrors, lateral couplings, grating couplers, and/or other optical coupling components and/or devices. Optical coupling bay be organized using waveguides and couplers embedded in substrate 220, in various embodiments.

Example Method of Fabricating a VCSEL and/or an Integrated VCSEL System

FIG. 3 provides a flowchart illustrating various processes, procedures, operations, and/or the like for fabricating VCSELs 100 on a silicon substrate and/or fabricating integrated VCSEL systems 200 comprising at least one VCSEL 100 in accordance with various embodiments of the present invention. The fabrication of VCSELs 100 generally comprises preparing a host blank, at step 302. The host blank may comprise a first reflector form fabricated on and/or mounted to a host substrate, such as a silicon wafer. The fabrication of VCSELs 100 generally comprises preparing an active blank, at step 304. For example, one or more layers that may be epitaxially grown on an active blank substrate. These epitaxially grown layers may be used to form a first contact layer, an active region, a tunnel junction, an oxide confinement layer, ion-implanted regions, and/or a second contact layer.

At step 306, the active blank is bonded to the host blank such that the exposed epitaxially grown layer is bonded to the first reflector form. The active blank substrate is then removed via etching, for example. The wafer is then processed for optical and current confinement, at step 308. For example, a buried tunnel junction may be formed, an oxide confinement layer may be formed, and/or ion-implanted regions may be formed to provide for optical and current confinement of the VCSEL(s) formed on the host substrate to provide partial VCSELs. At step 310, the wafer is processed for optical and electrical connections. For example, a second reflector may be formed on and/or bonded onto a second current spreading layer of the partial VCSELs, etching to form VCSEL mesas for each of the partial VCSELs may be performed, contacts may be deposited, and/or the like to generate VCSELs that are and/or that are configured to be electrically and/or optically coupled to one or more optical, electrical, or electro-optical components formed and/or mounted on the host substrate. At step 312, the host substrate (e.g., a silicon wafer) may be diced into individual chips, as appropriate for the application.

Figure 4A:
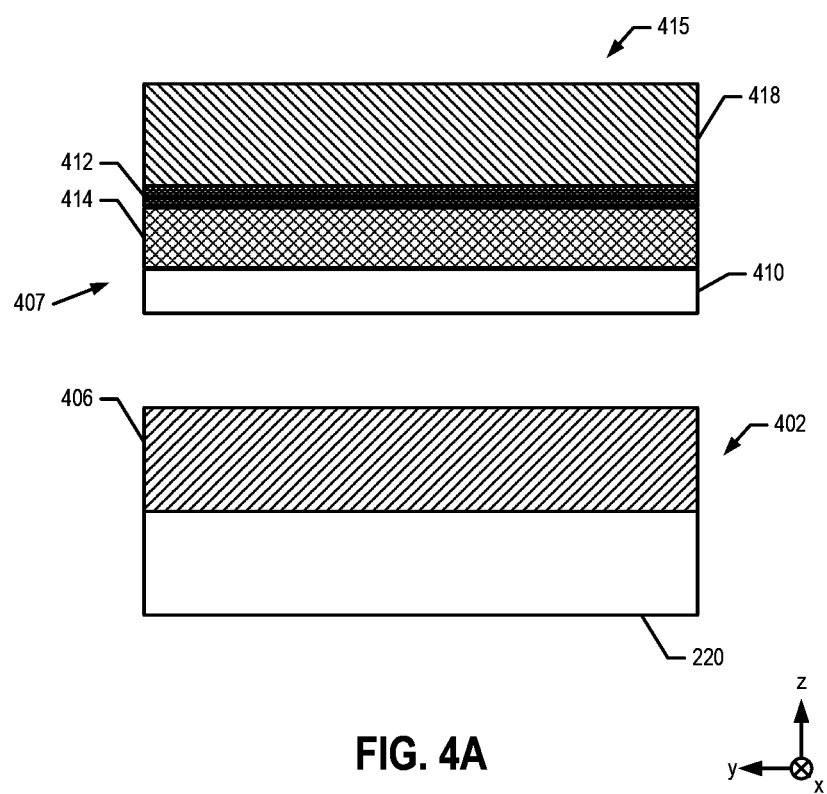

An example of the fabrication process for a VCSEL having buried tunnel junction current confinement will now be described with respect to FIGS. 3 and 4A-4E. As shown in FIG. 4A, and corresponding to step 302 of FIG. 3, a host blank 402 is prepared. In various embodiments, the host blank 402 comprises a first reflector form 406 formed on and/or mounted to a substrate 220 (e.g., a silicon wafer). Also shown in FIG. 4A, and corresponding to step 304 of FIG. 3, an active blank 415 may be prepared. In various embodiments, the active blank 415 may be formed by epitaxially growing layers of an active structure form 407 onto an active blank substrate 418 (e.g., an InP or GaAs substrate). For example, a first current spreading form 410, active region form 414, and tunnel junction form 412 may be formed and/or epitaxially grown on the active blank substrate 418.

Figure 4B:
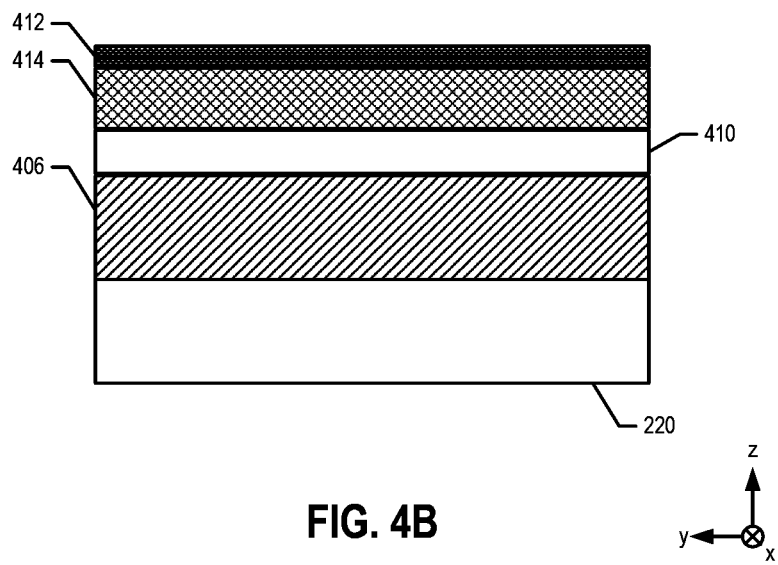

FIG. 4B shows an active blank 415 bonded onto a host blank 402 such that the exposed surface of the first reflector form 406 is bonded to the exposed surface of the first current spreading form 410 with the active blank substrate 418 removed, corresponding to step 306 of FIG. 3. For example, the host blank 402 may be bonded to the active blank 415 using any appropriate technique of various bonding techniques. The active blank substrate 418 is then removed via etching to form a bonded blank. The bonded blank is substantially non-varying in an xy plane, the xy plane being normal to an intended emission direction of the VCSEL 100.

Figure 4C:
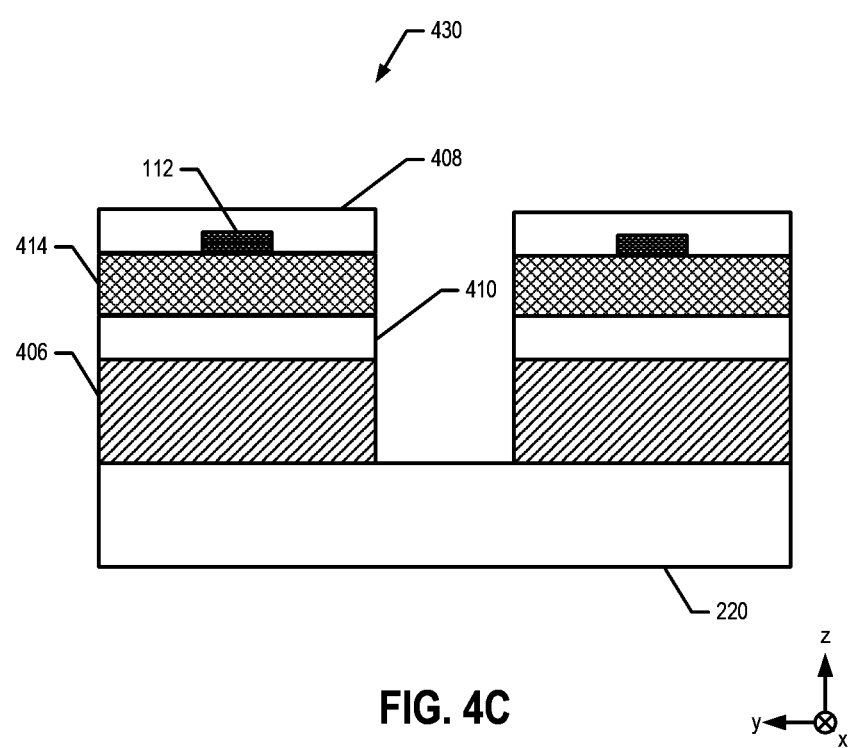

FIG. 4C shows the result of step 308 of FIG. 3 for a portion of the host substrate 220 that corresponds to two VCSELs 100. In particular, the tunnel junction form 412 may be overgrown and patterned to form a tunnel junction 112 for each VCSEL 100 being formed on the host substrate 220. In an example embodiment, the patterning of the VCSELs 100 and/or the tunnel junctions 112 may be performed prior to the overgrowth used to form the tunnel junctions 112 in order to avoid defect generation to thermal coefficient of expansion mismatch between various portions of the partial VCSELs 430. For example, the overgrowth of the tunnel junction form 412 to form the tunnel junction 112 may be performed at temperatures greater than 580° C. Due to the required high temperature, mismatches in the thermal coefficient of expansion between the tunnel junction form 412 and the active region form 414, for example, may lead to defects if patterning of the tunnel junction 112 (e.g., using etching such as photolithography and/or the like) is not performed before the overgrowth process is performed. After the buried tunnel junction 112 is overgrown and patterned, the second current spreading form 408 may be form and/or grown on the active region form 414 and/or the tunnel junction 112. For example, the second current spreading form 408 may be formed and/or grown such that the tunnel junction 112 is embedded within the second current spreading form 408. The buried tunnel junctions 112 is configured to provide both optical and current confinement for the VCSELs 100. The result of processing the wafer (e.g., host substrate 220 and the in-process VCSELs being formed thereon) for optical and current confinement (e.g., the overgrowth and patterning of the tunnel junction 112 and the growth and/or formation of the second current spreading form 408) is one or more partial VCSELs 430 on the host substrate 220.

Figure 4D:
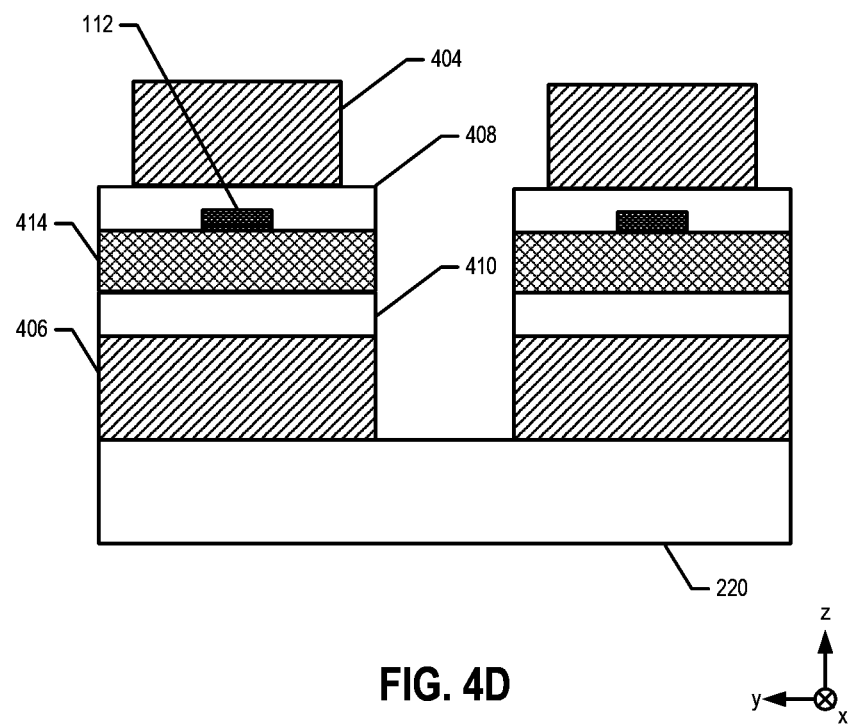
Figure 4E:
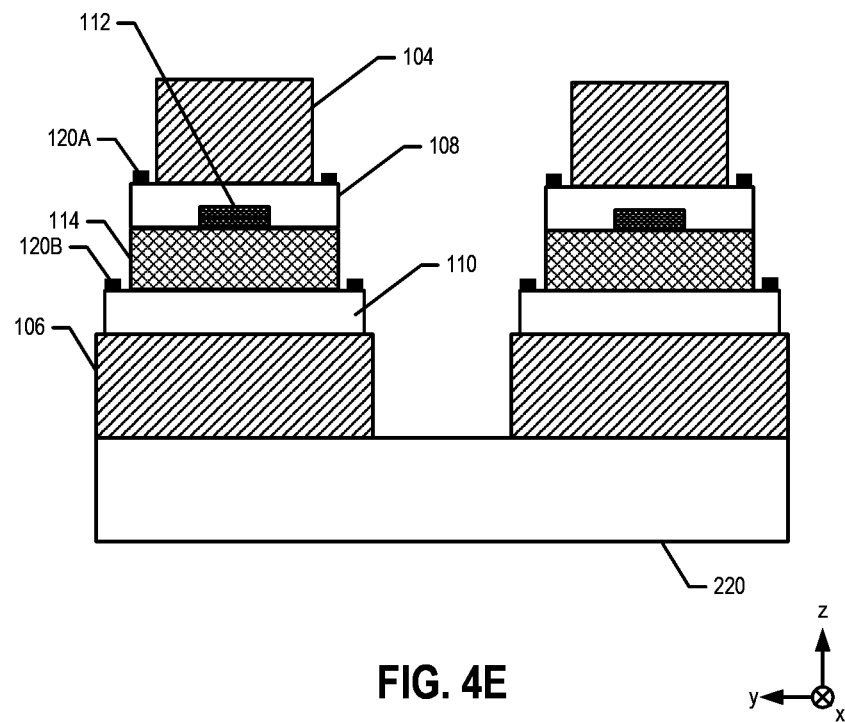

FIG. 4D shows the result of forming a second reflector form 404 onto the exposed surface of the second current spreading form 408 of the partial VCSELs 430. For example, the second reflector form may be formed by low temperature dielectric deposition by lift-off. FIG. 4E shows the result of patterning (e.g., via lithography and/or other etching technique) of the VCSELs 100 on the host substrate to form the second reflector 104, second current spreading layer 108, active region 114, first current spreading layer 110, and first reflector 106 from the second reflector form 404, second current spreading form 408, active region form 414, first current spreading form 410, and first reflector form 406, respectively. FIG. 4E additionally shows the results of the deposition of contact pads 120A, 120B onto the first current spreading layer 110 and the second current spreading layer 108, respectively. FIG. 4D shows an intermediate stage and FIG. 4E shows the result of processing the wafer to couple the VCSELs 100 formed on the host substrate into electrical and/or optical communication with other electrical, optical, and/or electro-optical components formed on the host substrate 220 and/or to configure the VCSELs 100 formed on the host substrate to be electrically and optically coupled to electrical, optical, and/or electro-optical components, as shown in step 310 of FIG. 3.

Figure 5A:
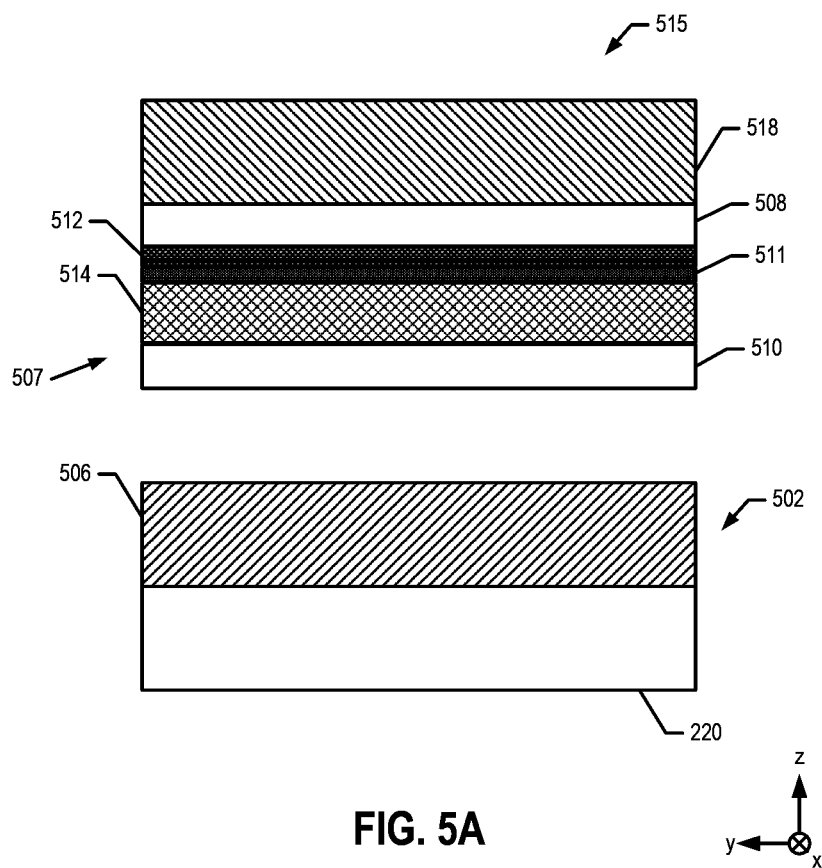

An example of the fabrication process for a VCSEL having oxide current confinement will now be described with respect to FIGS. 3 and 5A-5F. As shown in FIG. 5A, and corresponding to step 302 of FIG. 3, a host blank 502 is prepared. In various embodiments, the host blank 502 comprises a first reflector form 506 formed on and/or mounted to a substrate 220 (e.g., a silicon wafer). Also shown in FIG. 5A, and corresponding to step 304 of FIG. 3, an active blank 515 may be prepared. In various embodiments, the active blank 515 may be formed by epitaxially growing layers of an active structure form 507 onto an active blank substrate 518 (e.g., an InP or GaAs substrate). For example, a first current spreading form 510, active region form 514, a to-be oxidized layer 511, tunnel junction form 512, and second current spreading form 508 may be formed and/or epitaxially grown on the active blank substrate 518. In various embodiments, the to-be oxidized layer 511 is a dedicated Al containing layer. In an example embodiment, the to-be oxidized layer 511 comprises InAl(Ga)As and is configured to be oxidized to form the oxidation confinement layer 111.

Figure 5B:
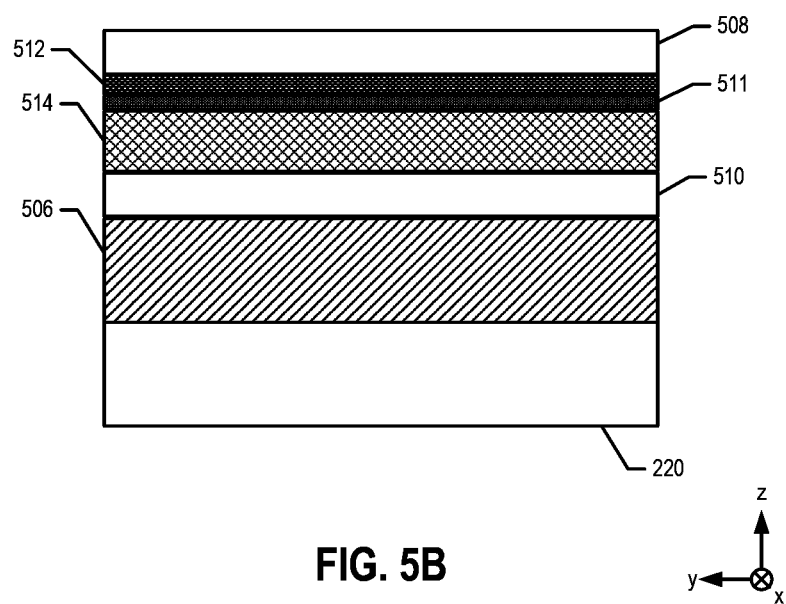

FIG. 5B shows an active blank 515 bonded onto a host blank 502 such that the exposed surface of the first reflector form 506 is bonded to the exposed surface of the first current spreading form 510 with the active blank substrate 518 removed, corresponding to step 306 of FIG. 3. For example, the host blank 502 may be bonded to the active blank 515 using any appropriate technique of various bonding techniques. The active blank substrate 518 is then removed via etching to form a bonded blank. The bonded blank is substantially non-varying in an xy plane, the xy plane being normal to an intended emission direction of the VCSEL 100.

Figure 5C:
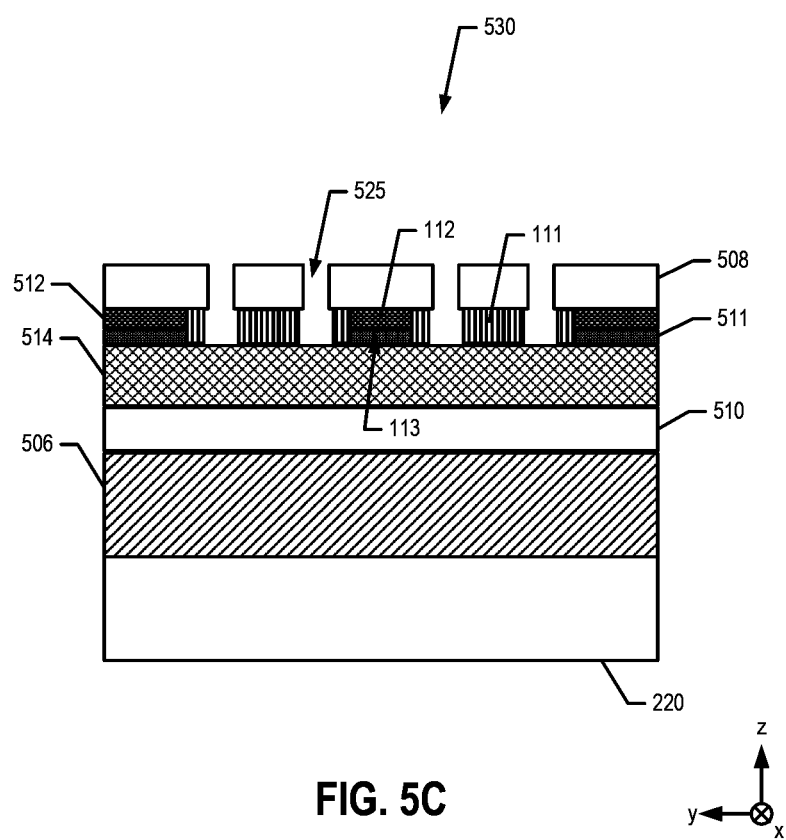

FIG. 5C shows the result of step 308 of FIG. 3 for a portion of the host substrate 220 that corresponds to one VCSEL 100. In particular, small holes 525 of diameters in the range of 1-3 um may be etched through the second current spreading form 508, tunnel junction form 512, and the to-be oxidized layer 511. In an example embodiment, the formation of the holes 525 may undercut the second current spreading layer 508. For example, the diameter of the holes 525 through the tunnel junction form 512 or the to-be oxidized layer 511 may be greater than the diameter of the holes 525 in the second current spreading layer 508. An oxidation process may be conducted to generate an oxidation confinement layer 111 having an aperture 113 therein. In various embodiments, the oxidation confinement layer 111 is formed by oxidizing a portion of the to-be oxidized layer 511 through the holes 525. The pattern of the holes is configured to ensure complete oxidation of the to-be oxidized layer 511 and the formation of the aperture 113 in the oxidation confinement layer 111. In an example embodiment, the oxidation process used to oxidize a portion of the to-be oxidized layer 511 is performed at a temperature in the range of 375-425° C. (e.g., 400° C.). For example, the oxidation may be performed by exposing the wafer to water vapor at a temperature greater than 300° C. In various embodiments, the oxidation process is carried out until the to-be oxidized layer 511 (e.g., the portions of the to-be oxidized layer that will form the oxidation confinement layer 111) is fully oxidized other than the aperture 113. The result of processing the wafer (e.g., host substrate 220 and the in-process VCSELs being formed thereon) for optical and current confinement (e.g., formation of the oxidation confinement layer 111 and definition of the tunnel junction thereby) is one or more partial VCSELs 530 on the host substrate 220.

Figure 5D:
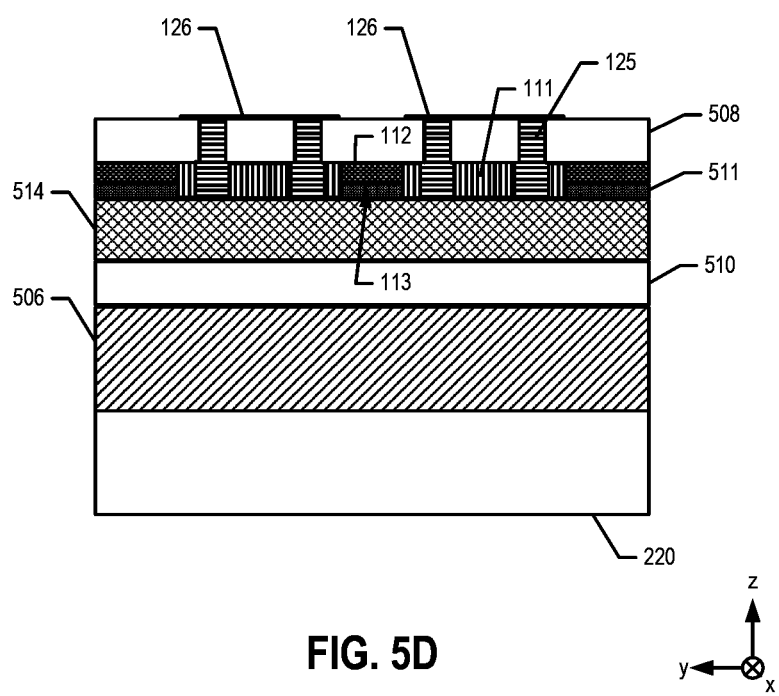

In an example embodiment, the holes 525 may be filled with a polymer or other material (e.g., Benzocyclobutene (BCB)) to generate plugs 125, as shown in FIG. 5D. A surface of the plugs 125 may be flush with the exposed surface of the second current spreading form 508. In an example embodiment, a thin ohmic contact 126 may be deposited and/or bonded onto the exposed surface of the second current spreading form 508 so, as to ensure good, low resistance electrical communication across all portions of the second current spreading form 508. The thin ohmic contact 126 may be formed of a layer of conductive material such as copper, gold, and/or the like. For example, the thin ohmic contact 126 may be similar to and/or perform similarly to contact layer 116.

Figure 5E:
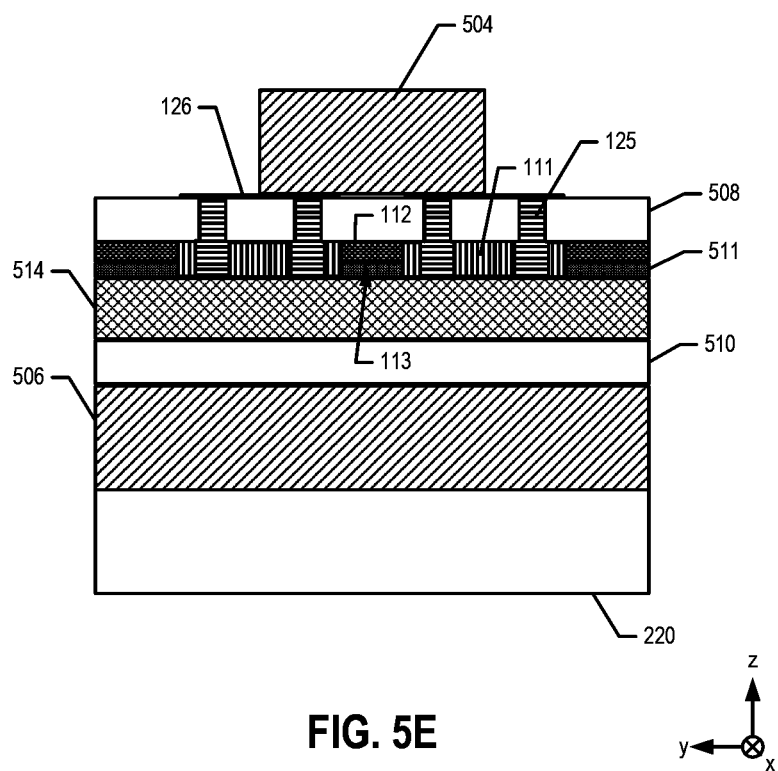
Figure 5F:
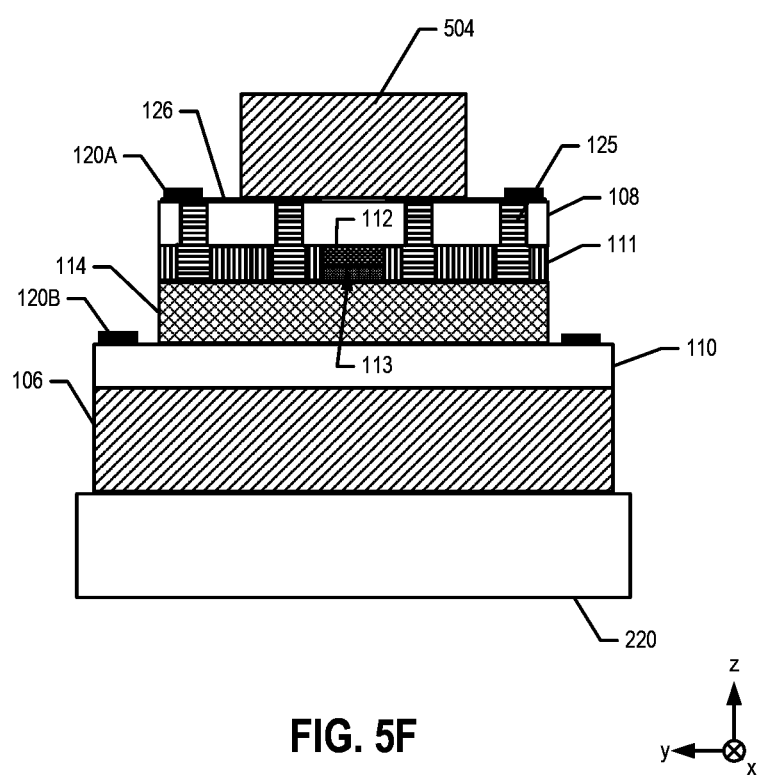

FIG. 5E shows the result of forming a second reflector form 504 onto the exposed surface of the second current spreading form 508 (and thin ohmic contact 126) of the partial VCSEL 530. For example, the second reflector form may be formed by low temperature dielectric deposition by lift-off. FIG. 5F shows the result of patterning (e.g., via lithography and/or other etching technique) of the VCSELs 100 on the host substrate 220 to form the second reflector 104, second current spreading layer 108, active region 114, first current spreading layer 110, and first reflector 106 from the second reflector form 504, second current spreading form 508, active region form 514, first current spreading form 510, and first reflector form 506, respectively. FIG. 5F additionally shows the results of the deposition of contact pads 120A, 120B onto the first current spreading layer 110 and the second current spreading layer 108, respectively. FIG. 5E shows an intermediate stage and FIG. 5F shows the result of processing the wafer to couple the VCSELs 100 formed on the host substrate into electrical and/or optical communication with other electrical, optical, and/or electro-optical components formed on the host substrate 220 and/or to configure the VCSELs 100 formed on the host substrate to be electrically and optically coupled to electrical, optical, and/or electro-optical components, as shown in step 310 of FIG. 3.

Figure 6A:
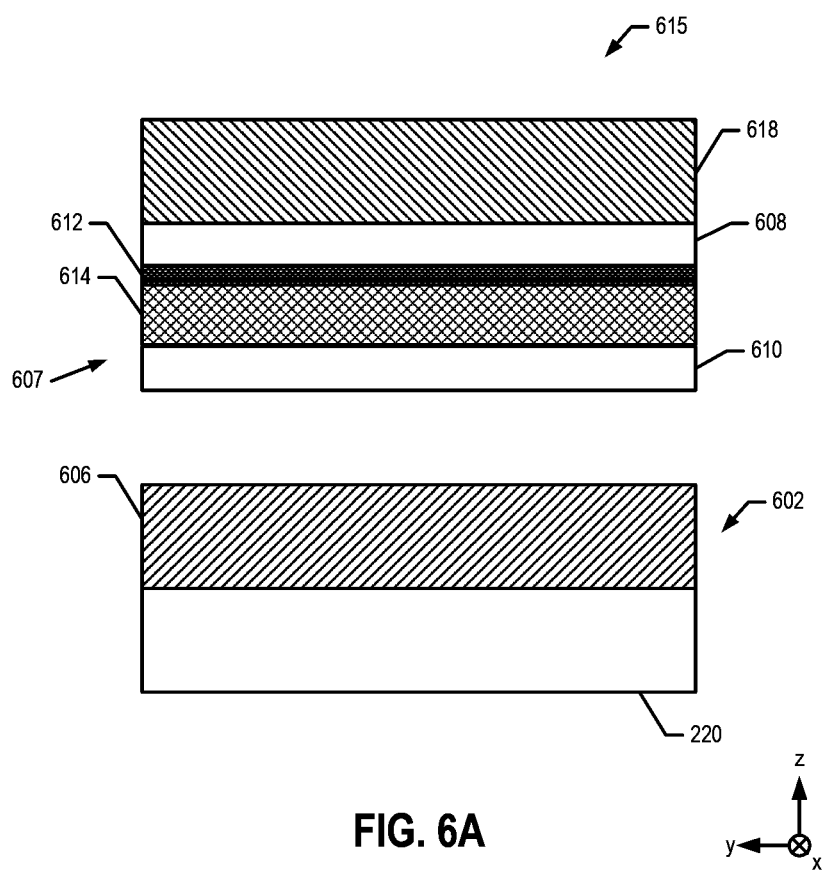

An example of the fabrication process for a VCSEL having ion-implanted current confinement will now be described with respect to FIGS. 3 and 6A-6F. As shown in FIG. 6A, and corresponding to step 302 of FIG. 3, a host blank 602 is prepared. In various embodiments, the host blank 602 comprises a first reflector form 606 formed on and/or mounted to a host substrate 220 (e.g., a silicon wafer). Also shown in FIG. 5A, and corresponding to step 304 of FIG. 3, an active blank 615 is prepared. In various embodiments, the active blank 615 is formed by epitaxially growing layers of an active structure form 607 onto an active blank substrate 618 (e.g., an InP or GaAs substrate). For example, a first current spreading form 610, active region form 614, tunnel junction form 612, and second current spreading form 608 may be formed and/or epitaxially grown on the active blank substrate 618.

Figure 6B:
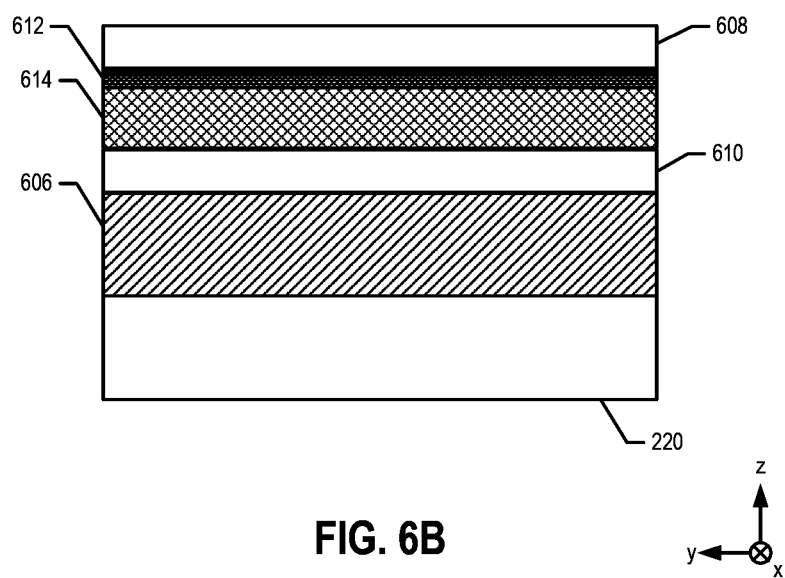

FIG. 6B shows an active blank 615 bonded onto a host blank 602 such that the exposed surface of the first reflector form 606 is bonded to the exposed surface of the first current spreading form 610 with the active blank substrate 618 removed, corresponding to step 306 of FIG. 3. For example, the host blank 602 may be bonded to the active blank 615 using any appropriate technique of various bonding techniques. The active blank substrate 618 is then removed via etching to form a bonded blank. The bonded blank is substantially non-varying in an xy plane, the xy plane being normal to an intended emission direction of the VCSEL 100.

Figure 6C:
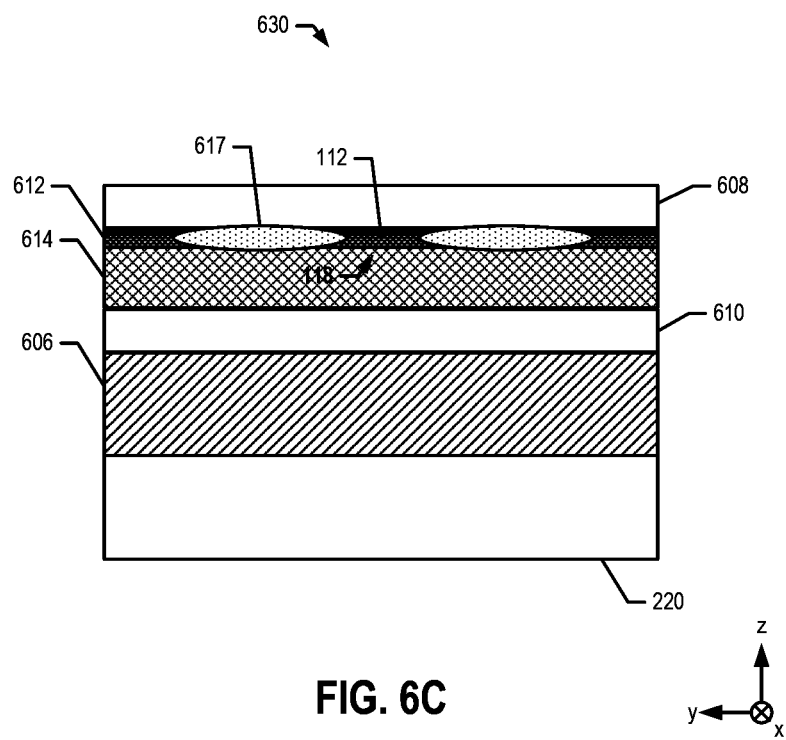

FIG. 6C shows the result of step 308 of FIG. 3 for a portion of the host substrate 220 that corresponds to one VCSEL 100. In particular, ions are implanted into portions of the tunnel junction form 612 to form implanted region forms 617. In various embodiments, the implanted region forms are generally annular in shape. For example, the internal radius of the generally annular shape of an implanted region form 617 may define an aperture 118 and the tunnel junction 112 within the aperture 118. In an example embodiment, the ion-implanted region 117 is formed by implanting protons. For example, the ions may be implanted in the ion-implanted region 117 with a density in the range of $2\text{-}6\times10^{14}$ per cm$^2$. In an example embodiment, the ions are implanted at an energy in the range of 150 to 200 keV. The implantation of the ions (e.g., protons) converts the ion-implanted region 117 from a semiconductor to an electrical insulator material. Implantation of the ions to form the implanted region forms 617 provides partial VCSELs 630 on the host substrate 220.

Figure 6D:
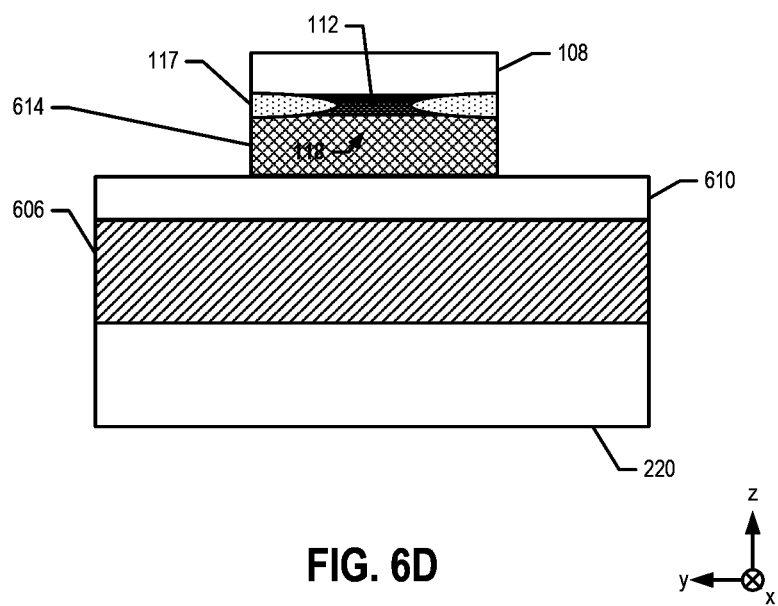
Figure 6E:
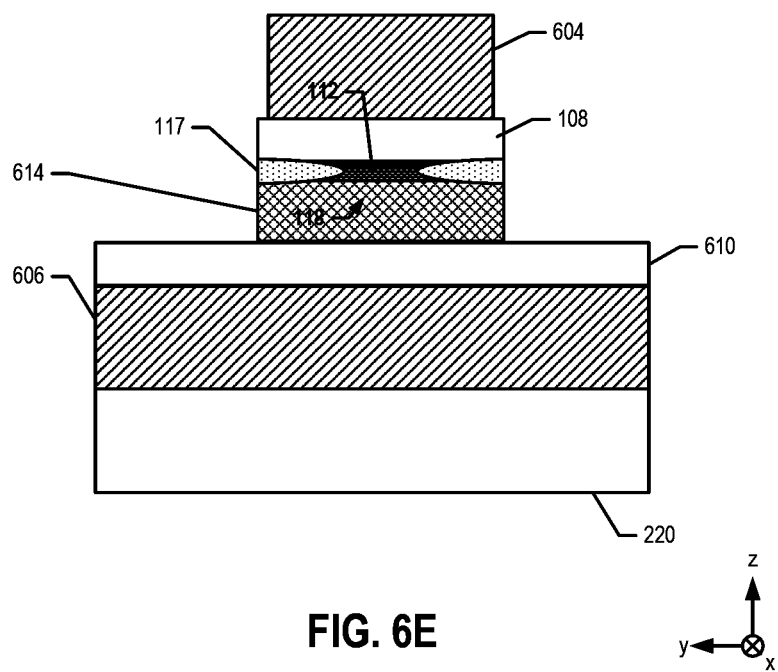
Figure 6F:
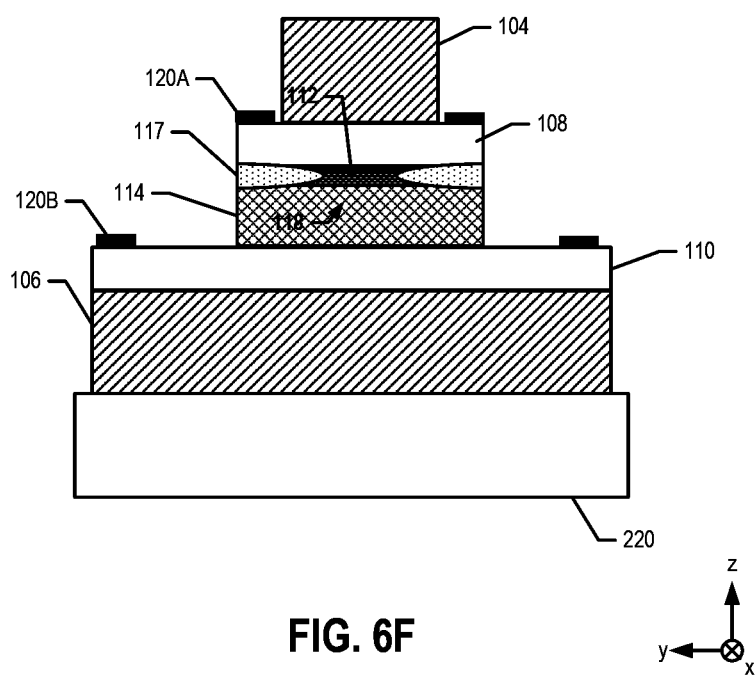

As shown in FIG. 6D, the mesa of the partial VCSEL 630 may be formed. For example, a wet etching technique may be used to pattern the mesa of the partial VCSELs 630 on the host substrate 220. FIG. 6E shows the result of forming a second reflector 604 onto the exposed surface of the second current spreading form 608 of the partial VCSEL 530. For example, the second reflector form may be formed by low temperature dielectric deposition by lift-off. FIG. 6F shows the results of the deposition of contact pads 120A, 120B onto the first current spreading layer 110 and the second current spreading layer 108, respectively. FIGS. 6D and 6E show intermediate stages and FIG. 6F shows the result of processing the wafer to couple the VCSELs 100 formed on the host substrate 220 into electrical and/or optical communication with other electrical, optical, and/or electro-optical components formed on the host substrate 220 and/or to configure the VCSELs 100 formed on the host substrate 220 to be electrically and optically coupled to electrical, optical, and/or electro-optical components, as shown in step 310 of FIG. 3.

Various embodiments include a combination of processing presented in FIGS. 4A-4E, 5A-5F, and/or 6A-6F.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A long wavelength vertical-cavity surface-emitting laser (VCSEL) comprising:
    a mesa structure disposed on a silicon substrate, the mesa structure comprising:
        a first reflector comprising a distributed Bragg reflector (DBR) mirror and a microelectromechanical system (MEMS) high contrast grating (HCG) mirror,
        a second reflector, and
        an active region disposed between the first and second reflectors and comprising quantum well and/or dots layers, wherein the quantum well and/or dots layers are configured to cause the VCSEL to emit light having a characteristic wavelength in 910-2000 nm wavelength range,
        wherein the first reflector is disposed closer to the silicon substrate than the second reflector;
    a first current spreading layer and a first contact, the first contact in electrical communication with the first current spreading layer, the first current spreading layer disposed between the first reflector and the active region; and
    a second current spreading layer and a second contact, the second contact in electrical communication with the second current spreading layer, the second current spreading layer disposed between the second reflector and the active region.

2. The long wavelength VCSEL of claim 1, wherein the active region further comprises at least one of (a) a buried tunnel junction, (b) a tunnel junction defined by an aperture of an oxidation confinement layer, or (c) a tunnel junction defined by an aperture of an ion-implanted confinement regions.

3. The long wavelength VCSEL of claim 1, wherein the second reflector comprises a distributed Bragg reflector mirror.

4. The long wavelength VCSEL of claim 1, wherein the MEMS HCG mirror is configured to enable wavelength tuning of light emitted by the long wavelength VCSEL.

5. The long wavelength VCSEL of claim 1, wherein the quantum well and/or dots layers comprise AlInGaAs formed using an epitaxial growth process.

6. The long wavelength VCSEL of claim 1, further comprising a silicon oxide layer disposed between the silicon substrate and the first reflector.

7. An integrated VCSEL system comprising:
a VCSEL comprising:
a mesa structure disposed on a silicon substrate, the mesa structure comprising:
a first reflector comprising a distributed Bragg reflector (DBR) mirror and a microelectromechanical system (MEMS) high contrast grating (HCG) mirror,
a second reflector, wherein the first reflector is disposed closer to the silicon substrate than the second reflector, and
an active region disposed between the first and second reflectors and comprising quantum well and/or dots layers; and
one or more optical, electrical, or electro-optical components mounted or formed on the silicon substrate, at least one of the one or more optical, electrical, or electro-optical components in at least one of direct electrical or optical communication with the VCSEL.

8. The integrated VCSEL system of claim 7, wherein a characteristic wavelength of the VCSEL is in a 910-2000 nm wavelength range.

9. The integrated VCSEL system of claim 7, wherein the at least one of the one or more optical, electrical, or electro-optical components is at least one of (a) in direct electrical communication with the VCSEL via a wire, trace, or lead or (b) in direct optical communication with the VCSEL via an optical coupling.

10. The integrated VCSEL system of claim 9, wherein the first reflector is configured to optically couple the VCSEL to at least one of the one or more optical, electrical, or electro-optical components.

11. The integrated VCSEL system of claim 7, wherein the MEMS HCG mirror is configured to enable wavelength tuning of light emitted by the VCSEL.

12. The integrated VCSEL system of claim 7, wherein a plurality of VCSELs are disposed on the silicon substrate.

13. The integrated VCSEL system of claim 7, wherein the active region further comprises one of (a) a buried tunnel junction or (b) a tunnel junction and an oxide confinement layer comprising an emission aperture therein or (c) an aperture defined by an ion-implanted region.

14. An integrated VCSEL system comprising:
a VCSEL comprising:
a mesa structure disposed on a silicon substrate, the mesa structure comprising:
a first reflector comprising a distributed Bragg reflector (DBR) mirror and a microelectromechanical system (MEMS) high contrast grating (HCG) mirror,
a second reflector, wherein the first reflector is disposed closer to the silicon substrate than the second reflector, and
an active region disposed between the first and second reflectors and comprising quantum wells; and
a component mounted or formed on the silicon substrate, wherein the component comprises an optical component or an electro-optical component, and wherein the MEMS HCG mirror optically couples the VCSEL to the component.

15. The integrated VCSEL system of claim 14, wherein the active region further comprises at least one of (a) a buried tunnel junction, (b) a tunnel junction defined by an aperture of an oxidation confinement layer, or (c) a tunnel junction defined by an aperture of an ion-implanted confinement regions.

16. The integrated VCSEL system of claim 14, wherein the second reflector comprises a distributed Bragg reflector mirror.

17. The integrated VCSEL system of claim 14, wherein the MEMS HCG mirror is configured to enable wavelength tuning of light emitted by the VCSEL.

18. The integrated VCSEL system of claim 14, wherein a characteristic wavelength of the VCSEL is in a 910-2000 nm wavelength range.

19. The integrated VCSEL system of claim 14, comprising a plurality of VCSELs disposed on the silicon substrate.

20. The integrated VCSEL system of claim 14, comprising:
a first current spreading layer and a first contact, the first contact in electrical communication with the first current spreading layer, the first current spreading layer disposed between the first reflector and the active region; and
a second current spreading layer and a second contact, the second contact in electrical communication with the second current spreading layer, the second current spreading layer disposed between the second reflector and the active region.

* * * * *